US012589905B2

(12) United States Patent
Müller et al.

(10) Patent No.: US 12,589,905 B2
(45) Date of Patent: Mar. 31, 2026

(54) FIBER-BASED CONTAINER

(71) Applicant: ALPLA WERKE ALWIN LEHNER GMBH & CO. KG, Hard (AT)

(72) Inventors: Florian Müller, Hard (AT); Robert Siegl, Dornbirn (AT)

(73) Assignee: ALPLA WERKE ALWIN LEHNER GMBH & CO. KG, Hard (AT)

( * ) Notice: Subject to any disclaimer, the term of this patent is extended or adjusted under 35 U.S.C. 154(b) by 104 days.

(21) Appl. No.: 18/571,716

(22) PCT Filed: Jun. 16, 2022

(86) PCT No.: PCT/EP2022/066477
§ 371 (c)(1),
(2) Date: Dec. 18, 2023

(87) PCT Pub. No.: WO2022/263591
PCT Pub. Date: Dec. 22, 2022

(65) Prior Publication Data
US 2024/0278954 A1 Aug. 22, 2024

(30) Foreign Application Priority Data

Jun. 16, 2021 (CH) .................................... 00702/21

(51) Int. Cl.
| | |
|---|---|
| *B65D 1/02* | (2006.01) |
| *B65D 23/02* | (2006.01) |
| *B65D 23/08* | (2006.01) |
| *B65D 65/46* | (2006.01) |
| *G06F 30/20* | (2020.01) |

(52) U.S. Cl.
CPC ........... *B65D 1/0215* (2013.01); *B65D 23/02* (2013.01); *B65D 23/0821* (2013.01); *B65D 65/466* (2013.01); *G06F 30/20* (2020.01); *B65D 2565/381* (2013.01)

(58) Field of Classification Search
CPC ...... B65D 1/0215; B65D 1/0207; B65D 1/02; B65D 1/40; B65D 65/466; B65D 65/46; B65D 23/02; B65D 23/0821; B65D 23/0814; B65D 23/0807
USPC ......... 215/12.2, 12.1, 382; 220/62.22, 62.12, 220/62.11, DIG. 30, DIG. 14, DIG. 11
See application file for complete search history.

(56) References Cited

U.S. PATENT DOCUMENTS

| | | | |
|---|---|---|---|
| 2006/0135668 A1 | 6/2006 | Hayes | |
| 2008/0277622 A1 | 11/2008 | Deshpande et al. | |
| 2012/0241406 A1* | 9/2012 | Beuerle | B32B 27/08 |
| | | | 428/35.7 |
| 2021/0206141 A1* | 7/2021 | Neufarth | B32B 27/365 |

(Continued)

FOREIGN PATENT DOCUMENTS

| | | | | |
|---|---|---|---|---|
| CA | 2734495 A1 * | 2/2010 | ............ | B65D 1/095 |
| EP | 1126083 A1 | 8/2001 | | |

(Continued)

*Primary Examiner* — Robert J Hicks

(74) *Attorney, Agent, or Firm* — MORRISS O'BRYANT COMPAGNI CANNON, PLLC

(57) ABSTRACT

The invention relates to a fiber-based container comprising a first layer made of compressed pulp, which forms a dimensionally stable sleeve and encloses an interior. The sleeve is at least partially coated with a second layer made of a partially crystalline polyester, and the partially crystalline polyester is applied in the form of a fluid or powder.

28 Claims, 1 Drawing Sheet

(56)    References Cited

U.S. PATENT DOCUMENTS

| 2021/0221551 | A1* | 7/2021 | Neufarth | ................. | B29B 11/14 |
| 2021/0309795 | A1* | 10/2021 | Nederberg | .............. | B32B 27/06 |
| 2021/0331369 | A1* | 10/2021 | Van Hove | ........... | B65D 83/771 |
| 2021/0362937 | A1* | 11/2021 | Van Hove | .............. | B29B 11/14 |
| 2022/0266498 | A1* | 8/2022 | Van Hove | .............. | B29B 11/08 |

FOREIGN PATENT DOCUMENTS

| JP | 2000109077 A | 4/2000 |
| JP | 2002173126 A | 6/2002 |

* cited by examiner

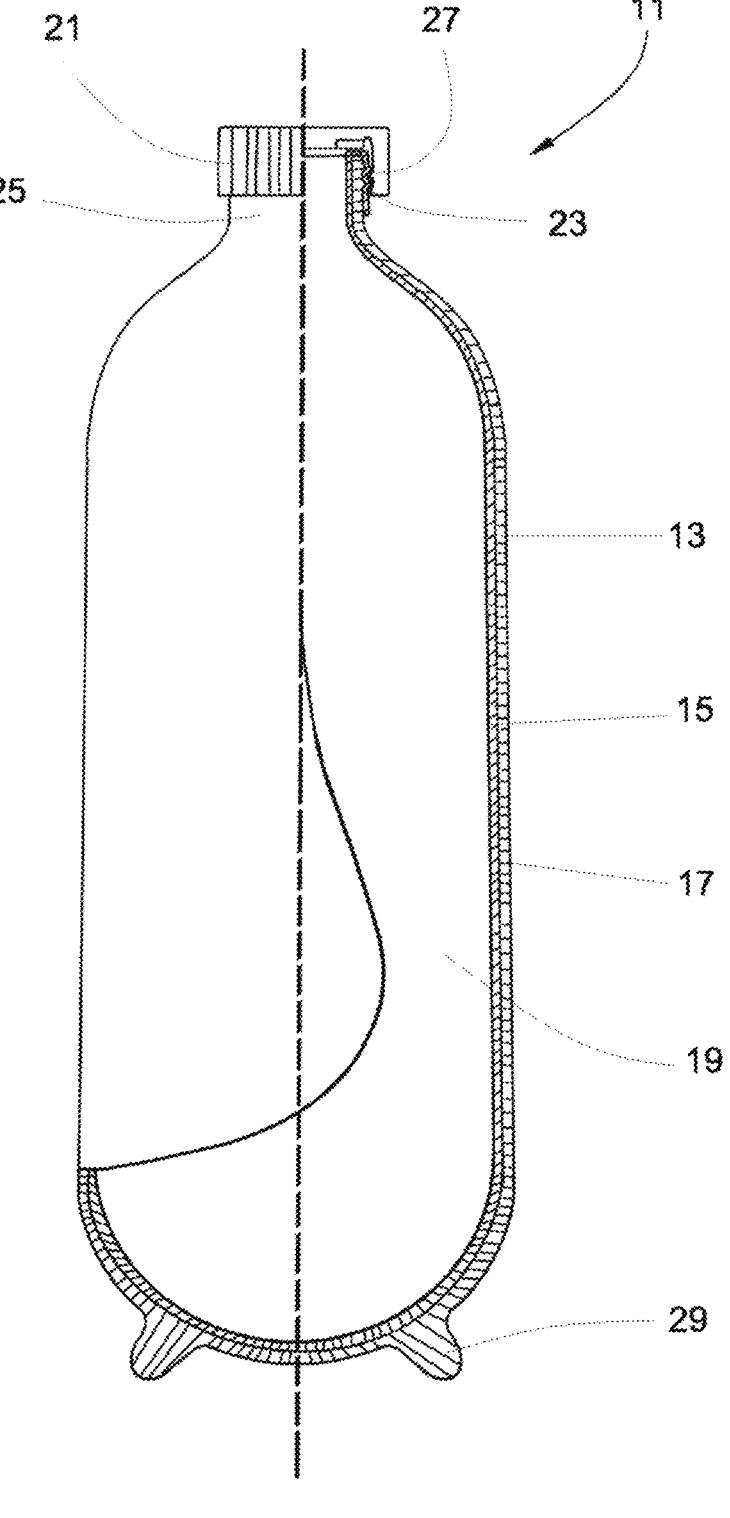

FIBER-BASED CONTAINER

CROSS-REFERENCE TO RELATED APPLICATIONS

This application is a national phase entry under 37 U.S.C § 371 of PCT/EP2022/066477 filed Jun. 16, 2022, which claims priority to Swiss Patent Application No. 00702/21 filed on Jun. 16, 2021, the entirety of each of which is incorporated by this reference.

FIELD OF THE INVENTION

The invention relates to containers and, more specifically, to fiber-based containers.

PRIOR ART

From the prior art in the field of beverage composite cartons, beverage containers made of coated cardboard have been known since the '60s of the past century. Before the cardboard is folded and glued or welded to form the container, it is coated, for example, with polyethylene and aluminum in order to produce a composite material.

These beverage cartons protect light-sensitive liquids and moreover have good barrier properties. The polyethylene is used as a liquid barrier and the aluminum is used as a light and oxygen barrier, whereas the cardboard provides the mechanical stability. Points where the cardboard box is folded, protruding, glued or welded, are not only a visual problem but also weak points of the cardboard packaging.

However, such beverage cartons have the disadvantage that they do not allow internal pressure since they can tear open and become leaky when an internal pressure occurs. Therefore, carbonated beverages cannot be filled, and the filled liquid cannot be treated with protective gas at excess pressure.

As a result of the production method, only very flat surfaces are usually possible; cambered surfaces, as they are realized, for example, in the shoulder of many beverage cartons, are only possible in that a plastic part without cardboard is inserted and welded. In the event of a pressure load, the flat surfaces are immediately cambered outward and make the container unacceptable for typical use even long before bursting.

In addition, such composite cartons with or without plastic inserts, or plastic closure, can be fed to a recycling process only with great effort, if at all. Beverage cartons therefore often land in landfills or are burned.

There are also beverage composite cartons that dispense with a metal coating because of better recyclability. Removal of the metal layer results in poorer barrier properties. Atmospheric oxygen can penetrate the cardboard packaging significantly better. Even components of the printing inks, in particular mineral-oil-based impurities of printing inks (MOSH, MOAH), but also very controversial impurities such as BPA, BPS. The UV and light barrier is also significantly weaker as a result of the removal of the reflective metal layer.

Instead of metals, polyesters are to be used in the future in part in cardboard packaging, in particular PET. PET has a good barrier against oxygen and contamination such as MOSH and MOAH, as well as BPA and BPS. Although PET, in contrast to polyolefins, has little or no creep and would be suitable for beverages with an internal pressure, the currently customary carton with welded layers is not suitable for applications with internal pressure since it is sensitive to internal pressure and tends to burst. The typical planar surfaces are not allowed to deform under pressure and make the packaging unusable even before bursting.

The customary beverage cartons of today also do not withstand a vacuum: In the case of an internal vacuum, the cartons collapse or implode. A vacuum inside a container is, however, absolutely necessary for many methods for applying a barrier layer directly to the finished packaging.

Advantages of the Invention

Based on the disadvantages of the described prior art, it is advantageous to create a pressure-resistant container which is made of a composite material containing cardboard and is biobased and in the best case biodegradable.

SUMMARY OF THE INVENTION

The advantages are achieved with a fiber-based container according to the independent claims. Developments and/or advantageous alternative embodiments form the subject-matter of the dependent claims.

A sleeve is coated at least partially with a second layer made of partially crystalline polyester and the partially crystalline polyester is applied in the form of a fluid or powder. As a result of the coating of the dimensionally stable sleeve, the container has good barrier properties with respect to water vapor, oxygen, and carbon dioxide so that it can be filled with carbonated beverages and can also be treated with protective gas. By applying the second layer in the form of a fluid or a powder, a homogeneous layer is formed which is free of defects and the barrier properties are correspondingly high as a result. The dimensionally stable sleeve does not have any folds or rebates, as a result of which the production of a homogeneous second layer is additionally facilitated.

It proves advantageous if the second layer is attached to the inner side of the sleeve, which faces the interior. As a result, the barrier properties required are present directly at the contact with the filling material. Moreover, the first layer is protected from the filling material.

In a further, particularly advantageous embodiment of the invention, the second layer takes over the function of the barrier from the filling material to the fiber material and the environment. The barrier properties are in the range of stretch-blow-molded PET bottles, even though the polyester has no chain orientation achieved by stretching.

The second layer is constructed by spherulitic polyester crystallization. The crystallites are spherical, arranged radially symmetrically and firmly connected to one another via amorphous intermediate regions. The formation of spherulites of seed crystals leads, in particular, to an excellent water vapor and oxygen barrier, without the second layer having to be stretched radially or axially.

Advantageously, the container is pressure-stable at an internal pressure of up to 8 bar of shaking pressure, wherein the pressure stability results from the shape and the mechanical properties of the first layer. In this case, the dimensionally stable sleeve is protected by the second layer from moisture and other environmental influences, which destroy its dimensional stability. The shaking pressure corresponds to the $CO_2$ pressure which arises during a standardized shaking operation. The shaking pressure is measured, for example, by means of a $CO_2$ tester from the company Steinfurth Mess-Systeme GmbH. As a result of the high shaking pressure, which the container according to the invention withstands, the container is suitable for filling carbonated beverages. The high pressure stability of the container also enables the container to be treated with protective gas after filling.

It is advantageous if the water vapor barrier (WVTR) of the container has a value of less than 4 g/m²d and advantageously of less than 1 g/m²d at 23° C. and 50% RH.

It is furthermore advantageous if the water vapor barrier (WVTR) of the container has a value of less than 15 g/m²d and preferably of less than 10 g/m²d at 30° C. and 80% RH or at 38° C. and 90% RH.

It is furthermore advantageous if the water vapor barrier (OTR) of the container has a value of less than 1 g/m²d and advantageously of less than 0.2 g/m²d at 23° C. and 80% RH. Here, RH stands for relative humidity. These barrier properties are achieved in that crystalline phases that correspond to a stretch-blow-molding process are achieved through spherulitic crystallization.

The $CO_2$ barrier is expediently defined in that the initial $CO_2$ concentration within the container is between 1 and 10 g/l and deviates from the initial value by no more than 5% and advantageously by no more than 1% within a period of one month. This barrier against carbon dioxide predestines the container for storing carbonated beverages.

It has proven expedient if the layer thickness of the second layer is less than 0.3 mm and advantageously less than 0.1 mm. As a result, the second layer can be applied in a material-friendly manner. The barrier values are sufficiently high at these layer thicknesses.

In a further, advantageous embodiment of the invention, the second layer has a biobased polyester fraction of at least 80 wt %, wherein the biobasis is defined according to the ASTM D 6866, CEN/TS 16137 and ISO 16620 standards. As a result, a biobased container can be provided since the fiber-based first layer is likewise biobased.

In a further, particularly advantageous embodiment of the invention, the second layer is biodegradable according to the DIN EN 13432 standard. This has the advantage that biodegradable polyesters can be used for seed-induced crystal growth, which enables the good barrier properties.

The second layer contains nucleating agents, such as talc or $CaCO_3$. As a result, particularly high crystalline fractions of the polyester can be produced, and the seed-induced crystal growth takes place reliably.

In a further, particularly advantageous embodiment of the invention, the crystallite melting point of the polyester is less than 245° C. and is advantageously between 200 and 180° C. As a result, the spherulitic crystallization takes place at temperatures at which the fiber structures of the pressure-stable sleeve are not destroyed.

The container expediently contains degradation accelerators for the polyester, in particular alkalizers for the saponification of the polyester and/or enzymes that separate the polyester. If plastics, advantageously up to 10 wt %, are present in the pulp, the degradation accelerators can quickly degrade even these plastics.

In a further, advantageous embodiment, the second layer is applied in a powder coating method with a subsequent sintering process or is applied in a spray method. These application methods ensure a homogeneous second layer without defects. As a result, the barrier values can be increased even further.

In addition, it is advantageous if the polyester is modified with a plasma coating for improving the barrier properties of the container.

The additional plasma coating is advantageously a glass coating on the basis of hexamethyldisiloxane (HDSMO) or a "diamond-like carbon" coating on the basis of acetylene.

As a result, any defects present are reliably covered since the second layer additionally obtains a hard layer.

The biobased polyester is expediently polyethylene terephthalate (PET), polyethylene furanoate (PEF), polyethylene isosorbide terephthalate (PEIT), polylactide (PLA), polybutylene succinate (PBS), poly-ε-caprolactone (PCL) or polyhydroxyalkanoate (PHA), in particular polyhydroxybutyrate (PHB). With suitable process control, these polyesters can form spherulites.

It is advantageous if the biobased polyester is produced in part from $CO_2$ exhaust gases. As a result, the fiber-based container is particularly sustainable, and the $CO_2$ values can be reduced.

It is advantageous if the biobased polyester is produced from biomass that is unsuitable as food. This biomass may be wood, algae, wastewater, agricultural or forestry wastes, feces, biowastes from households, agricultural products from overproduction or expired food.

In a further embodiment of the invention, the polyester of the second layer contains copolymers. The copolymers enable the crystallite melting point to be lowered, as a result of which the fiber structures of the first layer are neither impaired nor destroyed by excessively high temperatures.

The polyester expediently has a light barrier against UV light, visible light and infrared light, which brings about a transmission reduction between a wavelength of 350 and 550 nm of at least 30%, wherein the light barrier is advantageously realized by a coloring of the second layer. This protects vitamins and unsaturated fats in the filling materials. Decomposition reactions, which can cause poor taste or spoiling of the filling material, are prevented by the light barrier.

In order to additionally protect the filling material, the polyester advantageously reacts with atmospheric oxygen or advantageously contains additives that react with atmospheric oxygen, in particular oxygen scavengers, based on oxidation reactions with other polymers, e.g., polyamide. Before oxygen can come into contact with the filling material, it therefore completely reacts in the second layer.

It is advantageous if the polyester of the second layer is present in linear form, branched as long chain branches and short chain branches or crosslinked.

The container can be obtained in that the second layer is applied as a powder to the inner side of the sleeve by an electrostatic high-voltage method, e.g., an ionization method or a corona method, or a triboelectric or an electrokinetic friction method, and the container is baked in a sintering furnace, wherein a crystalline phase grows through spherulitic crystallization during the sintering process and the crystallization growth takes place by the addition of nucleating agent and holding the temperature between the glass transition temperature (TG) and the crystallite melting point (Ts). This enables particularly high crystalline fractions to form and a homogeneous second layer to be formed by the sintering. The high degree of crystallization of spherulitic (spherical) crystals and the homogeneous and defectless second layer lead to the excellent barrier values described above. The optimum of the crystallization is achieved by selecting the crystallization temperature between Ts and TG, which is specifically determined for each polyester.

In a further, advantageous embodiment, the container can be obtained in that the partially crystalline polyester is applied as a liquid or gas of present unsaturated polyesters or saturated polyesters to the inner side of the sleeve by means of spray methods, one-axis or multi-axis rotational molding, condensation methods and can additionally be covered with a plasma coating. This produces a particularly homogeneous and defectless second layer since the powdery or gaseous polyester reaches each point of the sleeve to be coated, several times.

Further advantages and features will become apparent from the following description of an embodiment of the invention with reference to the schematic drawings. In the FIGURE, in a representation that is not to scale:

BRIEF DESCRIPTION OF THE DRAWINGS

FIG. 1: shows a side view of a partially cut fiber-based container.

DETAILED DESCRIPTION OF THE INVENTION

FIG. 1 shows a container which is denoted as a whole by reference sign 11. The container 11 can be a bottle, as shown in FIG. 1. The container 11 has a first layer 13 and a second layer 15. The first layer 13 is molded from compressed pulp, which forms a dimensionally stable sleeve 17 and encloses an interior 19. Pulp is typically understood to mean a mixture of water, fibers (in particular paper fibers) and a binder.

The sleeve 17 is coated with the second layer 15 at least on the side facing the interior 19. The second layer is formed from a partially crystalline polyester, which is applied as a fluid or powder to the sleeve 17. As a result of the partially crystalline structure, the second layer can optimally fulfill the function of the barrier from the filling material to the fiber material and the environment. The first and the second layer therefore act as a composite material in which the individual layers 13, 15 fulfill different tasks in order to obtain a fluid-tight and pressure-stable container 11.

If the second layer 15 is also applied to the outer side of the sleeve 17, it can protect the sleeve against the environment. This is particularly practical if the container is used in a humid environment, such as a bath room, and is protected from moisture.

The container 11 can be closed with a screw cap 21 having an internal thread 23. For this purpose, the screw cap 21 can be screwed onto and unscrewed from the container neck 25. An external thread 27 is molded onto the first layer 13 on the container neck 25 and interacts with the internal thread 23. As shown in FIG. 1, the external thread 27 of the container can be coated with the second layer 15. By means of the coating with the second layer 15, the external thread 27 obtains additional mechanical stability and does not tear when the screw cap 21 is screwed on. On the outer side, standing feet 29 can be molded onto the dimensionally stable sleeve 17 so that the container can stand stably.

The composite of the first and second layers 13, 15 makes it possible for the container to withstand a shaking pressure of up to 8 bar. The container 11 is therefore suitable for filling carbonated beverages, such as mineral water or beer. The pressure stability results from the shape and the mechanical properties of the first layer 13, and the second layer 15 prevents the first layer 13 from being weakened by the filling material and the environment. The shaking pressure corresponds to the $CO_2$ pressure which arises during a standardized shaking operation. The shaking pressure is measured, for example, by means of a $CO_2$ tester from the company Steinfurth Mess-Systeme GmbH.

The second layer 15 is advantageously constructed by spherulitic crystallization. This results in the following barrier properties, through which the container 11 is suitable for the filling or storage of carbonated beverages. At 23° C. and 50% RH, the water vapor barrier (WVTR) of the container has a value of less than 4 $g/m^2d$ and advantageously less than 1 $g/m^2d$. At 30° C. and 80% RH or at 38° C. and 90% RH, the water vapor barrier (WVTR) of the container has a value of less than 15 $g/m^2d$ and advantageously less than 10 $g/m^2d$. The oxygen barrier (OTR) of the container has a value of less than 1 $g/m^2d$ and advantageously less than 0.2 $g/m^2d$ at 23° C. and 80% RH. The $CO_2$ barrier is defined in that the initial $CO_2$ concentration within the container is between 1 and 10 g/l and deviates from the initial value by no more than 5% and advantageously by no more than 1% within a period of one month. These barrier values result at a layer thickness of the second layer of less than 0.3 mm and advantageously less than 0.1 mm.

The present container is thus excellently suitable for filling carbonated beverages, wherein the second layer 15 is moreover biobased and biodegradable. The second layer has a biobased polyester fraction of at least 80 wt %, wherein the biobasis is defined according to the ASTM D 6866, CEN/TS 16137 and ISO 16620 standards. The biodegradability of the second layer is defined by the ASTM D 6866, CEN/TS 16137 and ISO 16620 standards.

The polyester of the second layer 15 has a light barrier with respect to UV light, visible light and infrared light, which brings about a transmission reduction between a wavelength of 350 and 550 nm of at least 30%, wherein the light barrier is advantageously realized by a coloring of the second layer. This light barrier makes it possible for vitamins and unsaturated fats in the beverages to be protected over a long time and not to be degraded or destroyed.

By using a spherulite-forming polyester, a second layer 15 with high crystalline fractions can be formed. As a result, the second layer 15, and thus also the container 11, has very good barrier values. Polyesters that can form spherulites can also be biobased and biodegradable. The sleeve 17 produced from a pulp provides the pressure stability. The container 11 according to the invention therefore not only has such high barrier values that it is suitable for receiving carbonated beverages but also withstands such high shaking pressure that an increased internal pressure cannot deform it. In addition, the container 11 is produced from a first and a second biobased layer 13, 15 and is biodegradable.

The invention claimed is:

1. Fiber-based container, comprising:
   a first layer of compressed pulp, which forms a dimensionally stable sleeve and encloses an interior; and
   a second layer made of a partially crystalline polyester applied in the form of a fluid or powder applied to and at least partially coating the sleeve.

2. Container according to claim 1, wherein the second layer is attached to the inner side of the sleeve, which faces the interior.

3. Container according to claim 1, wherein the second layer takes over the function of a barrier from filling material to the fiber material and the environment.

4. Container according to claim 1, wherein the second layer is constructed by spherulitic polyester crystallization.

5. Container according to claim 1, wherein the container is pressure-stable at an internal pressure of up to 8 bar of shaking pressure, wherein the pressure stability results from the shape and the mechanical properties of the first layer.

6. Container according to claim 1, wherein a water vapor barrier of the container has a value of less than 4 $g/m^2d$ at 23° C. and 50% RH.

7. Container according to claim 1, wherein a water vapor barrier of the container has a value of less than 15 $g/m^2d$ at 30° C. and 80% RH or at 38° C. and 90% RH.

8. Container according to claim 1, wherein an oxygen barrier of the container has a value of less than 1 $g/m^2d$ at 23° C. and 80% RH.

9. Container according to claim 1, wherein a $CO_2$ barrier is defined in that initial $CO_2$ concentration within the container is between 1 and 10 g/l and deviates from the initial value by no more than 5% within a period of one month.

10. Container according to claim 1, wherein a layer thickness of the second layer is less than 0.3 mm.

11. Container according to claim 1, wherein the second layer has a biobased polyester fraction of at least 80 wt %, wherein the biobasis is defined according to the ASTM D 6866, CEN/TS 16137 and ISO 16620 standards.

12. Container according to claim 1, wherein the second layer is biodegradable according to the DIN EN 13432 standard.

13. Container according to claim 1, wherein the second layer contains nucleating agents comprising talc or $CaCO_3$.

14. Container according to claim 1, wherein a crystallite melting point of the partially crystalline polyester is less than 245° C.

15. Container according to claim 1, wherein the container contains degradation accelerators for the polyester, comprising alkalizers for a saponification of the partially crystalline polyester and/or enzymes that separate the partially crystalline polyester.

16. Container according to claim 1, wherein the second layer is applied in a powder coating method with a subsequent sintering process or is applied in a spray method.

17. Container according to claim 1, wherein the partially crystalline polyester is modified with a plasma coating for improving one or more barrier properties of the container.

18. Container according to claim 17, wherein the plasma coating is a glass coating on a basis of hexamethyldisiloxane or a "diamond-like carbon" coating on a basis of acetylene.

19. Container according to claim 11, wherein the biobased polyester is polyethylene terephthalate, polyethylene furanoate, polyethylene isosorbide terephthalate, polylactide, polybutylene succinate, poly-ε-caprolactone, or polyhydroxyalkanoate.

20. Container according to claim 11, wherein the biobased polyester is produced in part from $CO_2$ exhaust gases.

21. Container according to claim 11, wherein the biobased polyester is produced from biomass that is unsuitable as food.

22. Container according to claim 1, wherein the partially crystalline polyester of the second layer contains copolymers.

23. Container according to claim 1, wherein the partially crystalline polyester has a light barrier against UV light, visible light and infrared light, which brings about a transmission reduction between a wavelength of 350 and 550 nm of at least 30%, wherein the light barrier is realized by a coloring of the second layer.

24. Container according to claim 1, wherein the partially crystalline polyester reacts with atmospheric oxygen or contains additives that react with atmospheric oxygen, based on oxidation reactions with other polymers.

25. Container according to claim 1, wherein the partially crystalline polyester of the second layer is present in linear form, branched as long chain branches and short chain branches or crosslinked.

26. Container according to claim 1, wherein
the second layer is applied as a powder to an inner side of the sleeve by an electrostatic high-voltage method, or a triboelectric or an electrokinetic friction method; and
the container is baked in a sintering furnace, wherein a crystalline phase grows through spherulitic crystallization during a sintering process and a crystallization growth takes place by an addition of nucleating agent and holding the temperature between a glass transition temperature and a crystallite melting point.

27. Container according to claim 26, wherein the partially crystalline polyester is applied as a liquid or gas of present unsaturated polyesters or saturated polyesters to an inner side of the sleeve by means of spray methods, one-axis or multi-axis rotational molding, condensation methods and additionally configured to be covered with a plasma coating.

28. Container according to claim 24, wherein the additives that react with atmospheric oxygen are oxygen scavengers.

* * * * *